United States Patent [19]
Popper

[11] Patent Number: 5,774,009
[45] Date of Patent: Jun. 30, 1998

[54] RTC OSCILLATOR AMPLIFIER CIRCUIT WITH IMPROVED NOISE IMMUNITY

[75] Inventor: Jay D. Popper, Jamaica, N.Y.

[73] Assignee: Standard Microsystems Corporation, Hauppauge, N.Y.

[21] Appl. No.: 799,253

[22] Filed: Feb. 14, 1997

[51] Int. Cl.$^6$ .................................................. H03K 17/16
[52] U.S. Cl. ......................... 327/379; 327/112; 327/299; 326/27
[58] Field of Search .................................. 327/379, 380, 327/381, 382, 383, 384, 108, 112, 134, 170, 310, 291, 299; 326/26, 27, 28

[56] References Cited

U.S. PATENT DOCUMENTS

| | | | |
|---|---|---|---|
| 5,089,728 | 2/1992 | Nguyen | 327/384 |
| 5,111,076 | 5/1992 | Tarng | 326/27 |
| 5,140,194 | 8/1992 | Okitaka | 326/27 |
| 5,497,105 | 3/1996 | Oh et al. | 326/27 |
| 5,537,067 | 7/1996 | Carvajal et al. | 327/112 |
| 5,592,104 | 1/1997 | Bach | 326/27 |

*Primary Examiner*—Toan Tran
*Attorney, Agent, or Firm*—Hopgood, Calimafde, Kalil & Judlowe, LLP

[57] ABSTRACT

A clock generator circuit that produces clock signals at the logic signal transitions at an output in response to a sinewave input control signal derived from an oscillator includes a delay means connected in one of the inverter-amplifier stages to prevent unwanted noise-induced logic transitions at the output, thereby to reduce significantly the adverse effects of oscillator and power supply noise on the clock output signal.

1 Claim, 3 Drawing Sheets

RTC OSCILLATOR AMPLIFIER CIRCUIT WITH IMPROVED NOISE IMMUNITY

FIELD OF THE INVENTION

The present invention relates generally to clock generator circuits, and more particularly to a clock circuit that provides a high level of immunity from the potentially adverse effects of noise on the clock output.

BACKGROUND OF THE INVENTION

One of the basic components of a computer is a real time clock (RTC) generator, which provides the timing signals at an accurately controlled frequency that control the operation of much of the computer circuitry. In a typical clock generator circuit, a high-frequency sinewave is derived from a crystal oscillator. The sine wave control signal is coupled, typically through a capacitor, to a series of inverter-amplifier output stages. The transitions of the sinewave during the negative and positive-going half cycles are converted to pulses at the output, that is, at the predetermined rate established by the crystal frequency and at a level typically greater than the amplitude of the sinewave signal generated by the crystal oscillator. The amplifier-inverter stages receive an internally generated supply voltage typically at a level of 1.5 volts.

The amplifier stages and the other portion of the clock generator circuit are vulnerable to noise from two potential sources. That is, noise of significant levels, e.g., 200 mv or more, is often found on the crystal sinewave output signal and on the power supply voltage, particularly since the clock generator is typically exposed to a very high noise environment: from the integrated circuit chip in which it is incorporated and the PC motherboard on which it is mounted.

High-frequency noise that occurs on the crystal oscillator sinewave output and power supply may cause undesired transitions between high and low logic levels at the clock output at times other than the transition logic levels that occur during each half-cycle of the sinewave control signal. Any of this noise that is coupled through the amplifier stages has the potential of causing the generation of extraneous clock signals, thereby corrupting the time-keeping function of the system clock and causing an erroneous operation of the many logic and other circuits whose operation is controlled by the clock. It is thus generally desired in the design of clock generator circuits of this type that the amplifier inverter stages be as noise-immune as possible.

To this end, attempts have been made to reduce the level of noise in the environment of the clock generator circuit such as, the provision of an increased amount of shielding on the PC motherboard and elsewhere. Attempts have also been made to reduce the adverse effects of noise on the operation of the clock generator by modification to the circuit. Whereas some of these efforts have produced an improvement in noise immunity of the clock generator, they often introduce additional problems such as an increase in the current drain. There thus exists a need for improved noise immunity in clock generator circuits.

It is therefore an object of the present invention to provide improved noise immunity in a clock generator circuit.

It is a further object of the invention to reduce significantly the potential adverse effects of noise on the operation of a clock generator circuit in a reliable and cost-efficient manner, and which does not increase the current drain of the circuit.

SUMMARY OF THE INVENTION

In accordance with the invention, a delay is interposed in one of the output amplifier-inverter stage of the circuit so that noise pulses that may be present on the crystal oscillator output or power supply do not produce undesired transitions in the output clock signal. In one embodiment of the invention, the delay includes a pair of parallel complementary MOS transistors biased to a high impedance and connected in between the inverter-amplifier complementary transistor pair.

BRIEF DESCRIPTION OF THE DRAWINGS

To the accomplishment of the foregoing and any other objects as may hereinafter appear, the present invention provides a clock generator circuit having improved noise immunity as described in the following detailed specification of a preferred embodiment considered with the accompanying drawings, in which:

Referring to FIG. 1, the circuit therein shown receives a sinewave input control signal from a crystal oscillator (not shown) at a terminal XTAL. The crystal output sinewave is passed through a succession of inverter-amplifier stages to an output terminal OUT at which a clock pulse is produced during each half-cycle of the sinewave control signal for use in a known manner to control the functions of external logic circuits that receive those clock signals.

Figure 1:
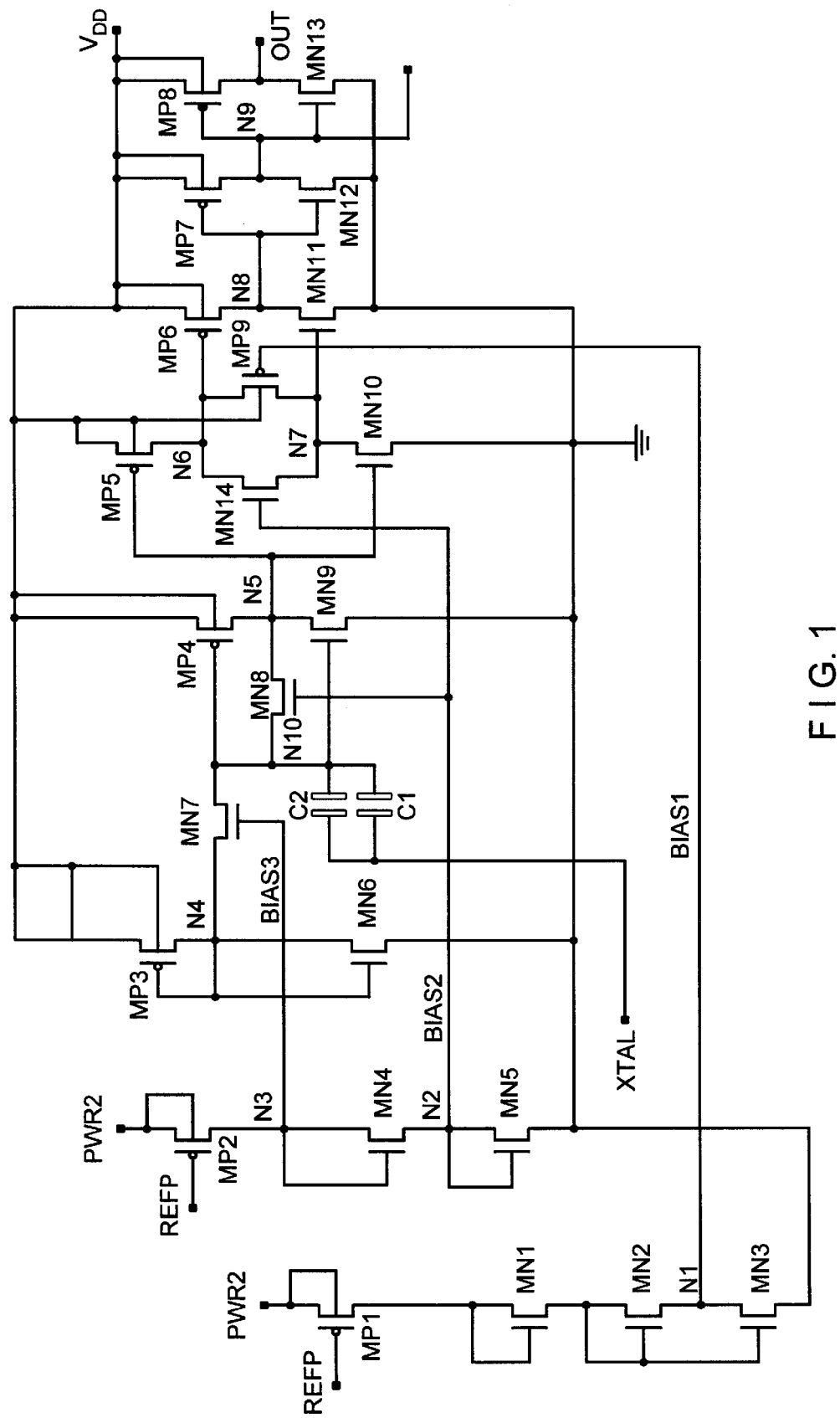
FIG. 1 is a schematic diagram of a clock generator circuit in accordance with a preferred embodiment of the invention.

As is conventional in a clock generator circuit of the type illustrated in FIG. 1, the inverter-amplifier stages receive an internally generated dc power supply voltage, at a typical value of 1.5 v, at a supply terminal $V_{DD}$. A conventional clock generator circuit is vulnerable to high-frequency noise that commonly appears on the crystal sinewave output signal, and on the $V_{DD}$ power supply voltage. This noise has the potential of causing undesired, sometimes, multiple transitions at the output, other than the desired times during each half-cycle of the sinewave control signal. These undesired transitions appear to be clock signals occurring at incorrect times. These undesired clock signals can corrupt the time-keeping function of the clock signals and are thus undesirable. The circuit of the present invention includes means to reduce those undesired transitions and thus preserves the accuracy of the clock signal output, even when the circuit is located in an environment, such as a PC motherboard, in which high-frequency noise is present.

The clock generator circuit of the invention, according to the embodiment illustrated in FIG. 1, includes a first voltage divider consisting of a PMOS device MP1 connected in series with NMOS devices MN1, MN2, and MN3 between a dc source PWR2 and ground. A reference voltage REFP is applied to the gate of device MP1. The signal at node N1 at the drain of device MN2 is a bias voltage BIAS1.

A second voltage divider consists of a PMOS device MP2 connected in series with MNOS devices MN4 and MN5 between the voltage source PWR2 and ground. The reference voltage REFP is applied to the gate of device MP2. A bias voltage BIAS2 is developed at the drain of device MN4 at node N2, and a bias voltage BIAS3 is developed at a node N3 at the drain of device MP2.

A reference voltage source includes an PMOS device MP3 connected in series between the $V_{DD}$ rail and ground with an NMOS device MN6. The drain of device MP3 is connected to its gate as well as to the gate of device MN6. A reference bias voltage established at node N4 at the drain of device MP3 is passed through the source-drain path of an NMOS device MN7 to the gate of a PMOS device MP4 to establish the desired dc bias point at that device. The gate of device MN7 receives the bias voltage BIAS3, which establishes the pass device MN7 at a high impedance level, in the order of 50–100 megohms.

The high-frequency sinewave output, typically at a frequency of 32.768 mHz and at a voltage of 500 mv, derived from the crystal at input XTAL is passed through parallel MOS capacitors C1, C2 to a node N10 and to the gate of device MP4, to the drain-source path of a pass MNOS device MN8, and to the gate of an NMOS device MN9. The gate of pass device MN8 receives the bias voltage BIAS2 to place it in the conductive state.

Devices MP4 and MN9 connected in series between the V rail and ground comprise a first, inverter-amplifier stage having an output at a node N5. Node N5 is connected to the gate of a PMOS device MP5 and an NMOS device MN10, which make up a second inverter-amplifier stage. A third inverter-amplifier stage consists of a PMOS device MP6 and an NMOS device MN11. The gate of device MP6 is connected to a node N6 at the drain of device MP5, and the gate of device MN11 is connected to a node N7 at the source of device MN10.

The output of the third inverter-amplifier at node N8 is connected to the gates of a PMOS device MP7 and an NMOS device NM12, which form an inverter-amplifier stage. The output of this stage at node N9 is applied to the gates of a PMOS device MP8 and an NMOS device MN13, which comprise the final output inverter-amplifier stage of the circuit. The clock signal output is derived at the output node OUT of this final stage.

In the conventional clock generator circuit of this type, the gate of the amplifier stage consisting of devices MP6 and MN11 would be connected in common to the output of the second amplifier stage consisting of devices MP5 and MN10. It has been found in the conventional clock generator circuit of this general design that noise on the crystal input at node N10 and on $V_{DD}$ may cause undesired transitions in the output clock signal. The circuit of FIG. 1 includes a delay circuit incorporated in one of the amplifier-inverter stages, here the second stage, that essentially eliminates the adverse effects of this noise on the clock output.

To these ends, in the clock circuit of the invention, an NMOS device MN14 and a PMOS device MP9 are connected in parallel with respect to one another and in series with the second amplifier stage device pair MP5 and MN10 between nodes N4 and N5. The gate of device MN14 receives the BIAS2 bias voltage, and the gate of device MP9 receives the BIAS1 bias voltage. The levels of bias voltages BIAS1 and BIAS2 are selected such that devices MP9 and MN14 are both biased in the subthreshold region, in the weak inversion domain, such that each is at a high impedance in the order of 50–100 megohms. For example, BIAS2 may be set to hold the gate of device MN14 at approximately 500 mv, whereas BIAS1 may be set to hold the gate of device MP9 at a bias of approximately 300 mv. Node N6 at the upper junction of devices MN14 and MP9 is connected to the gate of device MP6, whereas the gate of device MN11 is connected to a node N7 at the lower junction of devices MN14 and MP9. As will be described in greater detail below, the circuit consisting of devices MN14 and MP9 provides a delay between a change in signal levels at nodes N6 and node N7. Without that delay, a noise spike or pulse carried by the control signal sinewave could, as noted, cause an unwanted, erroneous transition in the clock output of the circuit.

Figure 2:
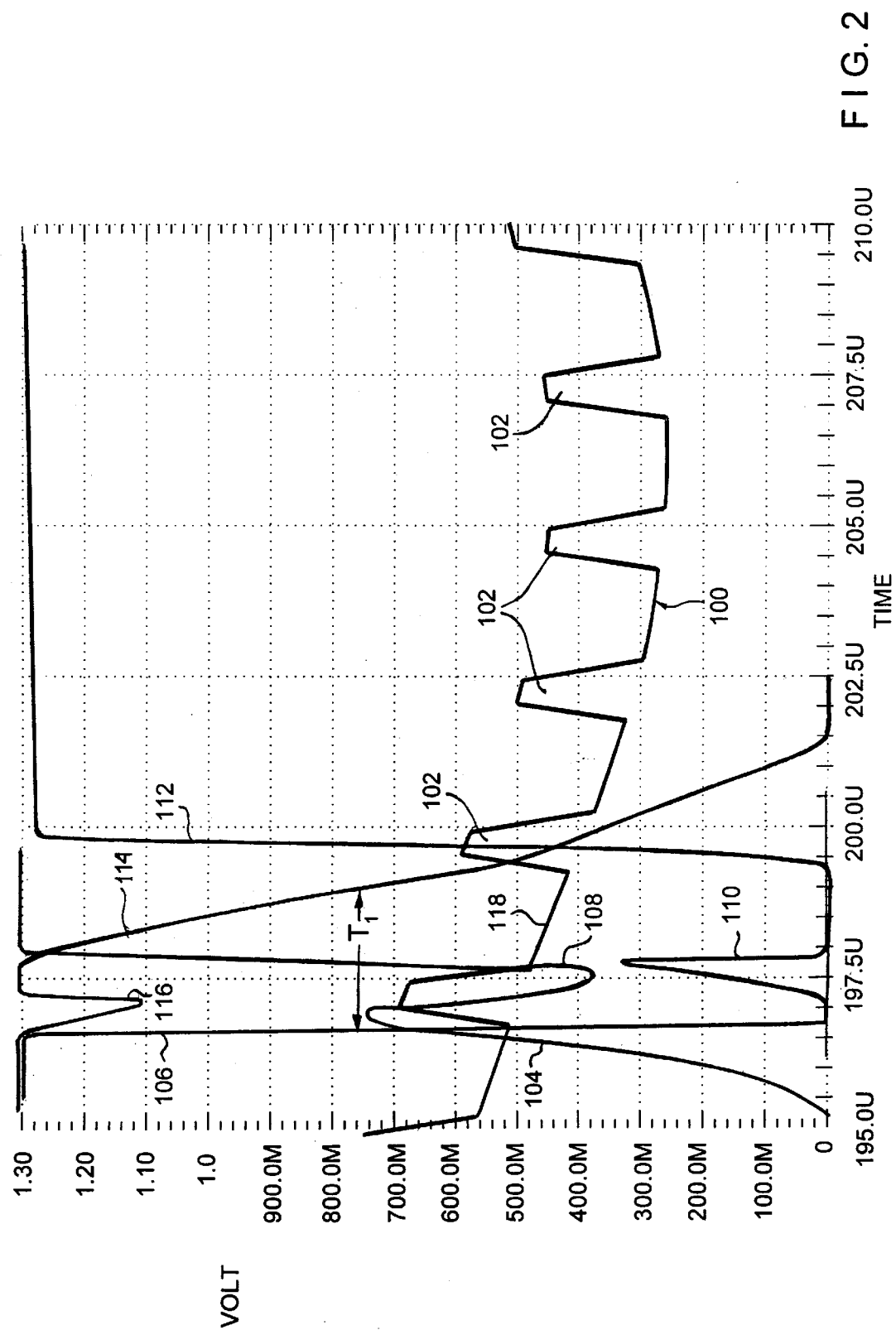
FIGS. 2 and 3 are plots illustrating the voltage waveforms at various nodes in the clock generator circuit of FIG. 1.

The operation of the circuit of FIG. 1 is now described with reference to FIGS. 2 and 3. As shown in FIG. 2, which illustrates the control signal sinewave 100 going in the negative direction, a series of noise spikes or pulses 102, which typically may be 200 mv or more, ride or are carried on the sinewave 100. As the level of sinewave 100 decreases, the conductivity of device MP4 increases and that of device MN9 decreases. As a result, as shown in FIG. 2, signal 104 at node N5 begins to rise toward $V_{DD}$. As signal 104 rises, it turns device MN10 on, which causes signal 106 at node N7 to be driven toward ground. The increase in signal 104 also causes device MP5 to be nonconductive cutting off node N6 from $V_{DD}$, and thereby causing node N6 to float and decrease slightly below $V_{DD}$ to level 116.

When a positive-going noise pulse 102 occurs on the sinewave signal, it increases the conductivity of device MN9 and decreases the conductivity of device MP4. This causes signal 104 to decrease sharply, as shown at 108. This decrease in signal 104 increases the conductivity of device MP5 causing signal 114 at node N6 to return to $V_{DD}$. At the same time, the conductivity of device MN10 is temporarily decreased causing signal 106 to rise momentarily toward $V_{DD}$ at 110.

If the signal 114 at node N6 were allowed to track signal 106 at node N7, so that, for example, when node N7 went to ground, node N6 would also go to ground. If this occurred, the noise-caused decrease 108 in signal 104 would be replicated in signal 114 and would thus be propagated through the amplifier-inverter stage of devices MP5 and MN10 to the circuit output as a logic signal transition, even though the control signal 100 at this time does not indicate such a logic transition.

To prevent this from occurring in the clock generator of the present invention, the transition in the signals at nodes N6 and N7 between logic 1(high) and logic 0(low) levels are delayed from one another by the action of devices MN14 and MP9 by approximately 2.5 microsecond, a period greater than the width of a typical noise pulse, e.g. 1 microsecond. As a result, as seen in FIG. 2, when the noise pulse is no longer present, as at 118, device MN9 is turned off, device MP4 is turned on and signal 104 at node N5 rises toward $V_{DD}$. As a result, device MP5 is turned off and device MN10 is turned on, causing signal 114 at node N6 to decrease to ground.

However, as shown in FIG. 2, the decrease of signal 114 at node N6 to ground is delayed from that of the signal 106 at node N7 by a period T1 as a result of the high resistance of device MN14, connected in series between nodes N6 and N7, and its associated capacitance. Device MN11 whose gate receives signal 106 from node N7 is turned off as signal 106 goes to ground, but device MP6, whose gate receives signal 114 from node N6, remains off until signal 114 decreases sufficiently following the delay from the decrease in signal 106. Signal 112 at node N8, which is initially at ground since device MN11 is initially conductive, remains at ground until signal 114 follows signal 106 toward ground to turn on device MP6 causing signal 112 to rise toward $V_{DD}$. The noise-caused spike 108 on signal 104 that occurred during delay interval T1 does not produce an undesired transition in signal 112, and thus does not produce an incorrect, undesired logic transition in the output clock pulse.

That is, when the signal at node N7 goes to ground, device MN11 is turned off. However, during the delay period T1, signal 114 at node N6 remains high so that device MP6 remains off and signal 112 remains at ground during this interval. Following the delay, signal 114 goes to ground causing device MP6 to be turned and the signal 112 to go high, as desired. Significantly, as shown in FIG. 2, since device MP6 remains off during the occurrence of the noise pulse 102, signal 112 remains unaffected by the presence of the noise pulse, and does not transition until the control sinewave signal 100 is below the safe threshold level of the input stage of devices MP4 and MN9.

The transition in signal 112 produces a corresponding transition in the final inverter-amplifier stages consisting of devices MP7 and MN12, and MP8 and MN13, respectively. The output of the latter stage at terminal OUT is the clock signal output of the circuit. Thus, as desired, signal 112 and the output clock signal experience only a single transition between a logic 0 and logic level 1 during the negative-going half-cycle of control sinewave signal 100 shown in FIG. 2, even in the occurrence of noise pulses 102 on the control signal and the resulting spike 108 on signal 104, which otherwise, as noted, could have caused an unwanted transition in signal 112.

Figure 3:
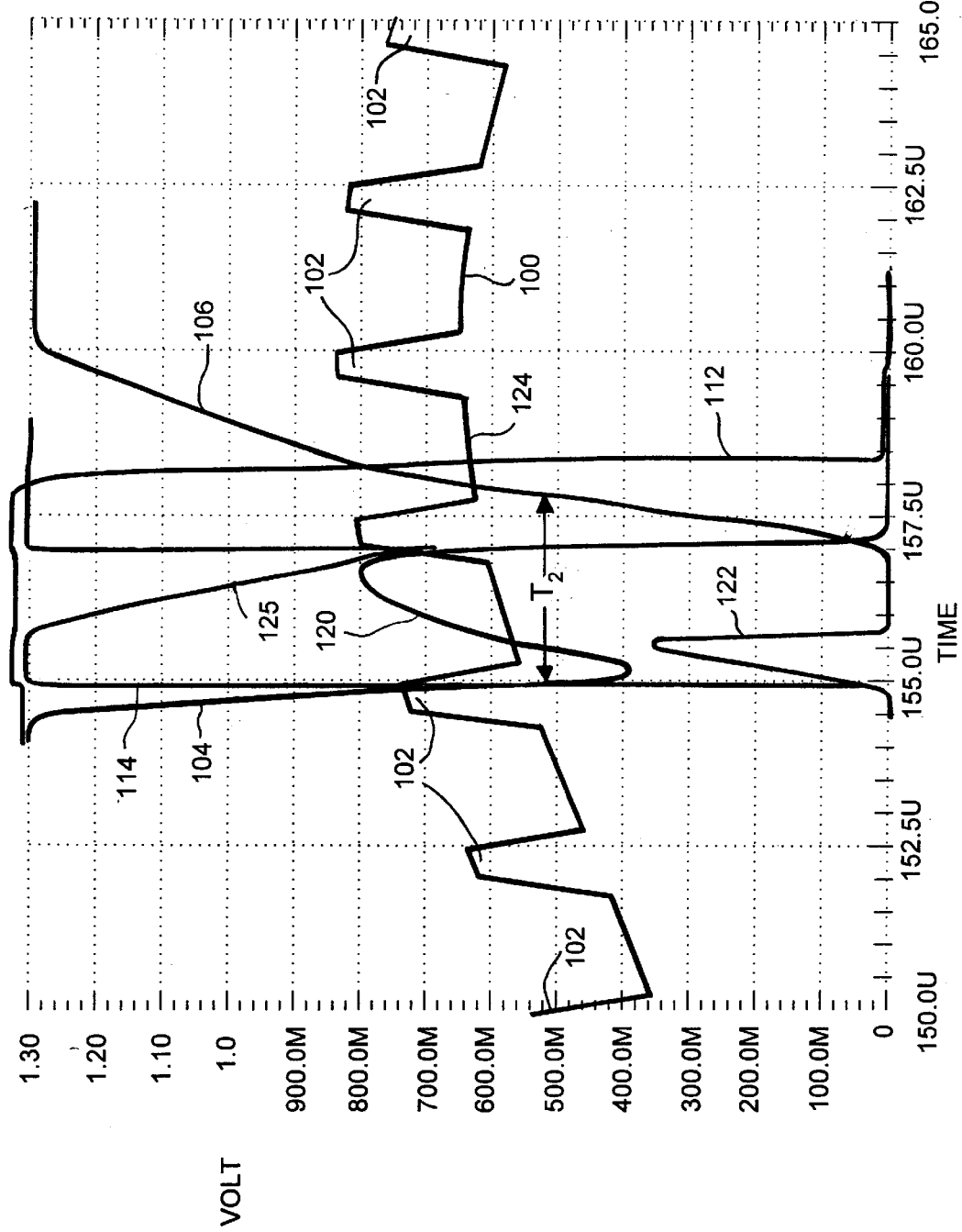

FIG. 3 is similar to FIG. 2 except that it illustrates the operation of the circuit of FIG. 1 during a positive-going half-cycle in the control sinewave signal 100. During this period, the operation described above with respect to FIG. 2 is reversed so that the signal 104 at node N5 decreases as device MN9 is turned on and device MP4 is turned off. At this time, signal 114 at node N6 rises toward $V_{DD}$ as device MP5 is turned on. The occurrence of a noise pulse 102 on the control sinewave signal 100 causes a positive rise 120 in signal 104 causing device MP5 to be less conductive and device MN10 to be more conductive. This, in turn, causes a negative-going spike 125 to be produced in signal 114 and returns signal 106 at node N7 to ground. Signal 104 then goes to ground as device MN9 is turned on by the increased level of control sinewave signal 100. This decrease in signal 104 causes device MP5 to be turned on and device MN10 to be turned off.

When this occurs, signals 114 at node N6 and 106 at node N, both tend to rise toward $V_{DD}$. However, the rise toward $V_{DD}$ of signal 106 is delayed by a time $T_2$ from the transition in signal. 114 by the high resistance and associated capacitance of device MP9 connected in series between nodes N6 and N7. Signal 106 thus does not go positive, and device MN11 is not turned on, until the end of delay internal $T_2$ when the noise pulse is no longer present on the sinewave control signal. Device MP6 is turned off and device MN11 remains off during delay internal $T_2$ until signal 106 rises sufficiently to turn device MN11 on. At that time, signal 112, as desired, transitions from $V_{DD}$ to ground. As shown in FIG. 3, signal 112, and thus the output clock signal, again experience only a single negative transition during the positive-going half cycle of the control sinewave signal 100 when that signal is at the desired transition level at 124.

The clock generator circuit of the present invention thus ensures the production of a clock output only at the desired logic transition of each half-cycle of the control sinewave signal, even in the presence of relatively high-level noise pulses that may be carried by the sinewave control signal. Moreover, since the inverter-amplifier devices, and particularly devices MP6 and MN11, are never on at the same time, the circuit does not draw current through this path thereby minimizing the current drawn by the circuit. This is an important feature since the clock generator circuit is typically the only circuit that is on when the computer in which it is incorporated is the shutdown or power-saving mode.

It will be understood from the foregoing description of a preferred embodiment of the invention that a clock generator circuit is described in which the generation of false or erroneous clock signals as a result of oscillator or power supply noise is practically eliminated. It will be further understood that although only a preferred embodiment has been described, modifications may be made thereto without necessarily departing from the spirit and scope of the invention.

What is claimed is:

1. A clock generator circuit comprising an input for receiving an input signal and an output at which a clock signal is produced during specified levels of said input signal, said circuit including a first inverter-amplifier coupled to said input, a second inverter-amplifier coupled to said output, and a third amplifier-inverter coupled intermediate said first and second inverter-amplifiers, said third inverter-amplifier including first and second nodes respectively coupled to first and second complementary MOS switching devices in said second inverter-amplifier and means coupled to said first and second nodes for delaying the transition of the signal at one of said first and second nodes with respect to the signal at the other of said first and second nodes in response to said input signal, said delaying means comprising third and fourth complementary MOS switching devices coupled in parallel with one another and in series between said first and second nodes, and means for applying a first and a second bias voltage to the gates of said third and fourth MOS devices, respectively, for biasing said third and fourth MOS devices in the subthreshold region, thereby to establish a relatively high impedance at said third and fourth MOS devices.

* * * * *